United States Patent [19]

Kuroda

[11] Patent Number: 4,543,449

[45] Date of Patent: Sep. 24, 1985

[54] SUPERCONDUCTING WIRE AND METHOD OF PRODUCING THE SAME

[75] Inventor: Kunishige Kuroda, Hitachi, Japan

[73] Assignee: Hitachi, Ltd., Tokyo, Japan

[21] Appl. No.: 556,048

[22] Filed: Nov. 29, 1983

[30] Foreign Application Priority Data

Dec. 1, 1982 [JP] Japan ................................ 57-209357

[51] Int. Cl.[4] ............................................. H01B 12/00
[52] U.S. Cl. .................................. 174/126 S; 29/599; 174/15 S; 174/128 S; 428/930
[58] Field of Search ............... 174/15 S, 126 S, 128 S; 29/599; 428/930

[56] References Cited

FOREIGN PATENT DOCUMENTS 36798 10/1974 Japan .
39239 10/1974 Japan .

Primary Examiner—A. T. Grimley
Assistant Examiner—Morris H. Nimmo
Attorney, Agent, or Firm—Antonelli, Terry & Wands

[57] ABSTRACT

A superconducting wire comprises a core region of a superconducting material, an outermost region of a normal-conducting material for stabilizing the superconducting material, and at least one intermediate region disposed between the core region and the outermost region. The intermediate region includes layers of the paramagnetic salt for increasing the heat capacity of the wire and layers of a normal-conducting material which are arranged alternatingly in the longitudinal or circumferential direction of the wire.

13 Claims, 8 Drawing Figures

SUPERCONDUCTING WIRE AND METHOD OF PRODUCING THE SAME

BACKGROUND OF THE INVENTION

The present invention relates to a superconducting wire and a method of producing the same. More particularly, the invention is concerned with a superconducting wire containing a paramagnetic salt as a third component and a method of producing such a superconducting wire.

Recently, it has been proposed to use a superconducting magnet in nuclear fusion systems of magnetic confinement type, as well as in high-energy accelerators. The superconducting magnet, when used in a nuclear fusion system, operates in the presence of a plasma, so that the following problem is encountered due to mutual interaction between the superconducting magnet and the plasma. Namely, when the plasma is started, the superconducting coil is subjected to an abrupt change in the magnetic field from an ohmic heating coil. This change in the magnetic field is on the order of 10 T/S to 50 T/S. The superconducting coil receives also a fluctuating magnetic field from a turbulency heating coil, ranging between about 5000 T/S and 10000 T/S. Furthermore, a drastic change in magnetic field on the order of several hundreds to several thousands T/S is applied to the superconducting magnet when the plasma is abruptly disrupted. These drastic changes in the magnetic field cause an a.c. (alternating current) loss in the superconducting coil to generate heat which heats up the superconducting magnet excessively. The superconducting magnet is heated also by nuclear heat of the particles produced as a result of the burning in the nuclear fusion reactor. As a result of the heating, the superconducting coil is liable to be changed into the normal state.

The same problem is encountered also in a high-energy accelerator incorporating a superconducting magnet. Namely, in such an accelerator, the superconducting magnet may be turned into the normal state by particles coming out of orbits and impinging upon the magnet. Needless to say, countermeasures are taken to prevent the heating of the superconducting magnet by electromagnetically shielding the same from the fluctuating magnetic field and also from the nuclear heat and impinging particles by means of a suitable shielding. These measures, however, cannot satisfactorily shield the superconducting magnet from the fluctuating magnetic field and the particles. It is, therefore, necessary to stabilize the superconducting wire itself, in order to prevent the superconducting magnet from becoming the normal state.

A typical conventional superconducting wire is composed of a region of normal-conducting material such as aluminum, copper or the like and a region of a superconducting material such as niobium-titanium (NbTi) or niobium 3-tin ($Nb_3Sn$). The region of the normal-conducting material occupies a cross-sectional area which is several to several tens times as large as that of the region of the superconducting material. Therefore, the heat capacity of the superconducting wire depends almost perfectly on the specific heat and the volume of the normal-conducting material.

FIGS. 1a and 1b show conventional superconducting wires having a circular cross-section and a rectangular cross-section, respectively. In either one of these conventional superconducting wires, a region 2 of the superconducting material is surrounded and covered by a region 3 of the normal-conducting material.

More specifically, each of the superconducting wires shown in FIGS. 1a and 1b has the region 2 of a superconducting material composed of niobium-titanium filaments 2a embedded in a copper matrix 2b and the region 3 of a normal-conducting material which is copper. Assuming that the weight ratio of the superconducting material 2 to the normal conduction material 3 is selected to be 1:20, that the temperature of refrigerant which is usually liquid helium is 4.2K, and that the critical temperature of the niobium-titanium is 10K, the superconducting wire 1 has a heat capacity of 3 mJ/g. Thus, an instantaneous and adiabatic heat input of this amount of heat causes the superconducting wire 1 to be changed into the normal state. Unfortunately, the heat input to the superconducting wire 1 by the aforementioned phenomena often exceeds the above-mentioned amount of heat, although it depends on various factors such as the condition of operation of the reactor and the scale of the reactor itself. This imposes a bottleneck on the application of the superconducting coil to nuclear fusion reactors.

In order to obviate this problem, there have been proposed superconducting wires as shown in FIGS. 2a and 2b which correspond to FIGS. 1a and 1b, respectively. The superconducting wires 1 shown in FIGS. 2a and 2b have the intermediate region 4 of a paramagnetic salt as a component thereof. More specifically, the superconducting wire shown in FIG. 2a and having a circular cross-section is provided with the intermediate region 4 of a paramagnetic salt interposed between the region 2 of the superconducting material and the region 3 of the normal-conducting material, while the superconducting wire 1 shown in FIG. 2b and having a rectangular cross-section is provided with the intermediate regions 4 of the paramagnetic salt interposed between the region 2 of the superconducting material and the region 3 of the normal-conducting material. The paramagnetic salt is an electric insulator and is not conductive thermally. Typical examples of the paramagnetic salt are $Ho_2Ti_2O_7$, $MnNH_4$ Tutton salt, $FeNH_4$ alum and CrK alum. The $MnNH_4$ Tutton salt, $FeNH_4$ alum and CrK alum exhibit specific heats which are several hundreds to several thousands times as large as the specific heat of the copper at cryogenic temperatures below 1K. These three paramagnetic salts, therefore, are used as materials for use in the method of adiabatic demagnetization.

The superconducting coil is usually used at temperature of 4.2K and, in some cases, at temperature of 1.8K. When $HO_2Ti_2O_7$ mentioned before is used at such low temperature, it exhibits a specific heat which is about 100 times as large as that of the copper and, hence, improves the heat capacity of the superconducting wire considerably. Generally, however, the paramagnetic salt exists in the form of inorganic crystals having large moisture absorbability and high fragility. Therefore, it is quite difficult to shape the paramagnetic salt into wire form together with the metals. Particularly, when the intermediate region 4 of the paramagnetic salt is positioned at the inner portion of the superconducting wire as shown in FIGS. 2a and 2b, the drawing for producing such superconducting wires encounters a difficulty in maintaining the uniformity of the cross-section, often resulting in rupture of the wire during drawing or fluctuation of the superconducting characteristics. Thus, it has been quite difficult to put the superconducting wire having paramagnetic salt into practical use.

SUMMARY OF THE INVENTION

Accordingly, an object of the invention is to provide a superconducting wire having a layer of paramagnetic salt for increasing the heat capacity, improved to permit a stable processing by drawing and to eliminate the fluctuation of the superconducting characteristics, thereby to increase the practicability of the superconducting wire.

The invention provides also a method which is suitable for producing such a superconducting wire.

To these ends, according to one aspect of the invention, there is provided a superconducting wire comprising a core region of a superconducting material, an outermost region of a normal-conducting material for stabilizing the superconducting material, and at least one intermediate region disposed between the core region and the outermost region and containing a paramagnetic salt for increasing the heat capacity at cryogenic temperature range, wherein the intermediate region includes layers of the paramagnetic salt and a normal-conducting material which are arranged alternatingly.

According to another aspect of the invention, there is provided a method of producing a superconducting wire comprising the steps of preparing a superconducting material and a normal-conducting material surrounding the superconducting material such that at least one space is formed therebetween, charging the space alternatingly with pieces of a paramagnetic salt and a normal-conducting material and pressurizing the pieces to compact the same, evacuating the thus formed structure with its one end closed, closing the other end of the structure to form a billet, and subjecting the billet to drawing.

The above and other objects, features and advantages of the invention will become clear from the following description of the preferred embodiments taken in conjunction with the accompanying drawings.

DESCRIPTION OF THE PREFERRED EMBODIMENTS

Figure 1A:
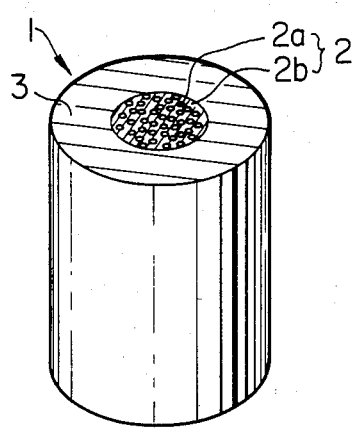
FIG. 1a is a perspective view of a conventional superconducting wire having a circular cross-section.
Figure 1B:
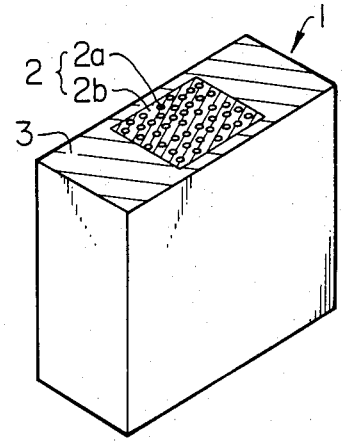
FIG. 1b is a perspective view of another conventional superconducting wire having a rectangular cross-section.
Figure 2A:
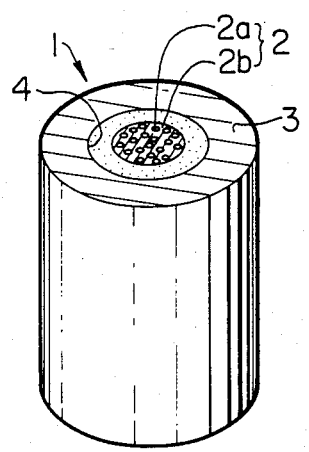
FIG. 2a is a perspective view of still another conventional superconducting wire having a circular cross-section and provided with an annular layer of a paramagnetic salt.
Figure 2B:
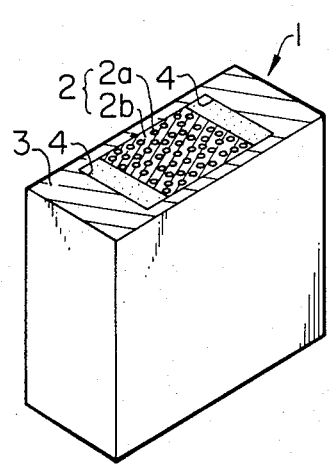
FIG. 2b is a perspective view of a further conventional superconducting wire having a rectangular cross-section and provided with internal layers of a paramagnetic salt.

Preferred embodiments of the invention will be described hereinunder with reference to FIGS. 3a to 5 in which the same reference numerals are used to denote the same parts or members as those used in FIGS. 1a to 2b showing prior arts.

Figure 3A:
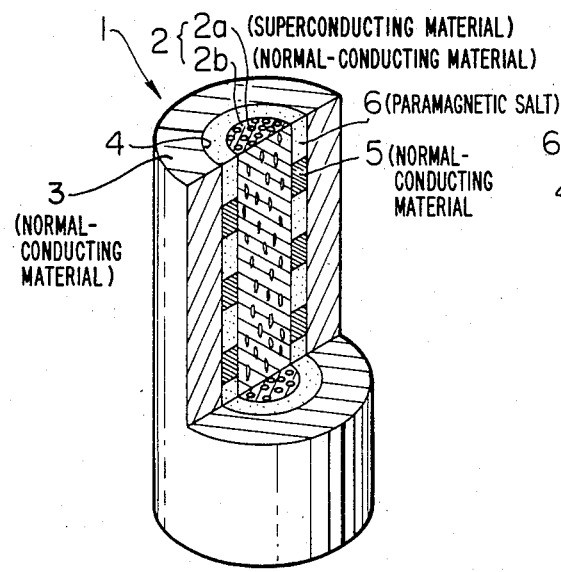
FIG. 3a is a partly-sectioned perspective view of a superconducting wire in accordance with a first embodiment of the present invention having a circular cross-section.
Figure 3B:
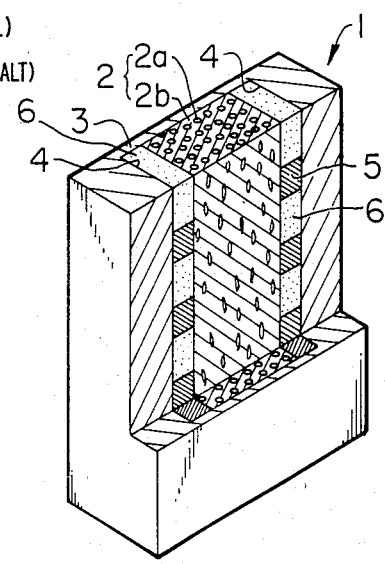
FIG. 3b is a partly-sectioned perspective view of another superconducting wire in accordance with the first embodiment of the present invention having a rectangular cross-section.

FIGS. 3a and 3b show superconducting wires in accordance with a first embodiment of the invention, having a circular cross-section and a rectangular cross-section, respectively. The superconducting wire 1 shown in FIG. 3a has a core region 2 of a superconducting material, an annular intermediate region 4 surrounding the core region 2, and an outermost region 3 of a normal-conducting material surrounding the intermediate region 4. On the other hand, the superconducting wire shown in FIG. 3b has intermediate regions 4 disposed between the core region 2 of the superconducting material and the outermost region 3 of normal-conducting material. In either case, the intermediate region 4 is composed of layers 6 of a paramagnetic salt and layers 5 of a normal-conducting material which are arranged alternatingly in the longitudinal direction of the superconducting wire 1.

The superconducting wire of the first embodiment well meets the requirement for the increase in the heat capacity, owing to the presence of the layers 6 of a paramagnetic salt. In addition, the alternating arrangement of the layers 6 of the paramagnetic salt and the layers 5 of the normal-conducting material makes the drawing easy and eliminates the problems of the prior art such as rupture of the wire or fluctuation of the diameter of wire almost perfectly. This in turn eliminates the undesirable fluctuation of the superconducting characteristics of the superconducting wire and, hence, increases the practicability of the same. When this wire is used as the wire of a superconducting magnet, the temperature rise of the wire can be suppressed to a sufficiently small level even by a heat generation on the order of several J/g, so that the superconducting magnet can operate stably without being accompanied by an abrupt evaporation of the refrigerant. Thus, the superconducting wire of this embodiment can be used quite suitably as the wire of a superconducting magnet for a nuclear fusion reactor or a high-energy accelerator.

In this first embodiment, the normal-conducting material constituting the layers 5 is preferably the same as the normal-conducting material constituting the outermost region 3, or a different material having a greater ductility than the material of the outermost region 3.

This arrangement provides also other advantages such as elimination of the problem attributable to the moisture absorbability of the paramagnetic salt and thermal connection of the superconducting material constituting the core region 2 to permit a good conduction of heat from the core region 2. Consequently, the performance of the superconducting conductor 1 is improved remarkably.

When electric current is applied to the wire during actual use, an electromagnetic force is generated to cause a mechanical movement of the core region 2 of the superconducting material. This movement, however, is effectively prevented by the layers 5 of the normal-conducting material.

Figure 4:
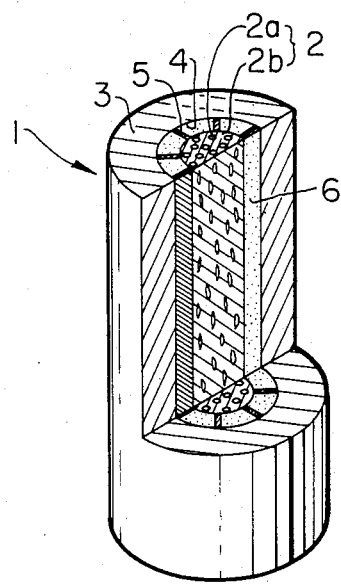
FIG. 4 is a partly-sectioned perspective view of a superconducting wire in accordance with a second embodiment of the invention.

FIG. 4 shows a second embodiment of the invention in which the layers 6 of the paramagnetic salt and the layers 5 of the normal-conducting material are arranged alternatingly in the circumferential direction.

Figure 5:
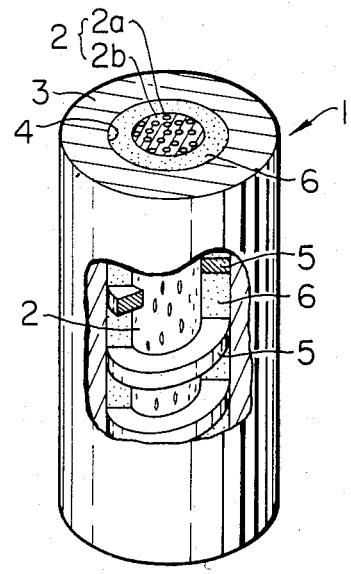
FIG. 5 is a partly cut-away perspective view of a superconducting wire in accordance with a third embodiment of the invention.

FIG. 5 shows a third embodiment of the invention. In this embodiment, the layer 5 of the normal-conducting material is wound in a spiral form and the layer 6 of the paramagnetic salt is formed to fill the space between adjacent turns of the layer 5 of the normal-conducting material. This arrangement permits an easy drawing as compared with the arrangement shown in FIG. 3, to thereby reduce the possibility of rupture during drawing as well as fluctuation of the wire diameter. The fluctuation of the wire diameter is suppressed remarkably also when the wire is twisted.

An explanation will be made hereinunder as to a method of producing the superconducting wire.

Prior to the drawing, pieces of a paramagnetic salt which will constitute the layers 6 of the paramagnetic salt and pieces of a normal-conducting material which will constitute the layers 5 of the normal-conducting material are charged alternatingly into a space defined between a normal-conducting material which will become the outermost region 3 and a superconducting material which will become the core region 2. This superconducting material partly contains a normal-conducting material. Then, the pieces of the paramagnetic salt and the pieces of the normal-conducting material are compressed and compacted to fill the space. Subsequently, this structure is evacuated with its one end closed and, after the evacuation, the other end is also closed to complete a billet. This billet is then subjected to drawing to become the superconducting wire of the invention. Various methods can be taken for the production of the superconducting wire having a rectangular cross-section as shown in FIG. 3b. Basically, however, this type of superconducting wire can be fabricated by filling the spaces defined between the normal-conducting material constituting the outermost region 3 and the superconducting material constituting the core region 2 alternatingly with the pieces of the paramagnetic salt and the pieces of the normal-conducting material to form the billet and then drawing the same into a flat shape having a rectangular cross-section. The superconducting wire of the invention can be fabricated also by a process having the steps of forming the outermost region 3 and the intermediate region 4 as a unit with each other into a first element of an intermediate or the final size, while forming the core region 2 containing both of the superconducting material and the normal-conducting material into a second element of an intermediate or the final size, and then combining the first and second elements with each other. When both elements are drawn to the intermediate size, the composite structure obtained through combining these two elements is drawn to the final size after the combining.

Although not shown in the drawings, the invention does not exclude the employment of a fourth region constituted by a normal-conducting material such as aluminum.

As has been described, the invention provides a superconducting wire comprising a core region of a superconducting material, an outermost region of a normal-conducting material for stabilizing the superconducting material, and at least one intermediate region disposed between the core region and the outermost region and containing a paramagnetic salt for increasing the heat capacity at a cryogenic temperature range, wherein the intermediate region includes layers of the paramagnetic salt and a normal-conducting material which are arranged alternatingly.

The invention also provides a method of producing a superconducting wire comprising the steps of preparing a superconducting material and a normal-conducting material surrounding the superconducting material such that at least one space is formed therebetween, charging the space alternatingly with pieces of a paramagnetic salt and a normal-conducting material and pressurizing the pieces to compact the same, evacuating the thus formed structure with its one end closed, closing the other end of the structure to form a billet, and subjecting the billet to drawing.

The superconducting wire of the invention, therefore, possesses a large heat capacity owing to the provision of the layers of the paramagnetic salt. In addition, since the layers of the paramagnetic salt and the normal-conducting material are arranged alternatingly, the superconducting wire of the invention can be stably produced by drawing without the fear of rupture of wire and fluctuation of the wire diameter. Consequently, the undesirable fluctuation of the superconducting characteristics of the superconducting wire is obviated to increase the practicability of the superconducting wire containing a paramagnetic salt.

What is claimed is:

1. A superconducting wire comprising a core region of a superconducting material, an outermost region of a normal-conducting material for stabilizing said superconducting material, and at least one intermediate region disposed between said core region and said outermost region and containing a paramagnetic salt for increasing the heat capacity at cryogenic temperature range, wherein said intermediate region includes layers of said paramagnetic salt and a normal-conducting material which are arranged alternatingly in the longitudinal or circumferential direction of said superconducting wire.

2. A superconducting wire according to claim 1, wherein said layers of paramagnetic salt and normal-conducting material are disposed alternatingly in the longitudinal direction of said superconducting wire.

3. A superconducting wire according to claim 1, wherein said core region has a circular cross-section and said outermost region has an annular cross-section so that an annular space is formed between said core region and said outermost region, said layers of paramagnetic salt and normal-conducting material being disposed to fill said annular space alternatingly in the longitudinal direction of said superconducting wire.

4. A superconducting wire according to claim 1, wherein said core region has a circular cross-section and said outermost region has an annular cross-section so that an annular space is formed between said core region and said outermost region, said layers of paramagnetic salt and normal-conducting material being disposed to fill said annular space alternatingly in the circumferential direction of said superconducting conductor.

5. A superconducting wire according to claim 1, wherein said core region has a circular cross-section and said outermost region has an annular cross-section so that an annular space is formed between said core region and said outermost region, said layers of paramagnetic salt and normal-conducting material being arranged spirally and alternatingly to fill said annular space.

6. A superconducting wire according to claim 1, wherein said outermost region has a rectangular cross-section and accomodates said core region which also has a rectangular cross-section such that spaces extending in the longitudinal direction of said superconducting wire are formed between said core region and said outermost region, said layers of paramagnetic salt and normal-conducting material being disposed to fill each of said spaces alternatingly in the longitudinal direction of said superconducting wire.

7. A method of producing a superconducting wire comprising the steps of preparing a superconducting material and a normal-conducting material surrounding said superconducting material such that at least one space is formed therebetween, charging said space alternatingly in the longitudinal or circumferential direction of said superconducting wire with pieces of a paramagnetic salt and a normal-conducting material and pressurizing said pieces to compact the same, evacuating the thus formed structure with its one end closed, closing theother end of said structure to form a billet, and subjecting said billet to drawing.

8. A superconducting wire according to claim 1, wherein the normal-conducting material included in the intermediate region is the same as the normal-conducting material used for the outermost region.

9. A superconducting wire according to claim 1, wherein the normal-conducting material included in the intermediate region is a material having a greater ductility than that of the normal-conducting material used for the outermost region.

10. A method of producing a superconducting wire comprising the steps of forming an outermost region and an intermediate region as a unit with each other, said outermost region being formed of a normal-conducting material and said intermediate region being formed of layers of a paramagnetic salt and a normal-conducting material which are arranged alternatingly in the longitudinal or circumferential direction of said superconducting wire, said unit of the outermost region and intermediate region being formed to accommodate a core region therein; forming a core region including a superconducting material; and combining said unit and said core region, with said core region being accommodated in said unit.

11. A superconducting wire comprising a core region of a superconducting material, an outermost region of a normal-conducting material for stabilizing said superconducting material, and at least one intermediate region disposed between said core region and said outermost region and containing a paramagnetic salt for increasing the heat capacity at cryogenic temperature range, wherein said intermediate region includes layers of said paramagnetic salt and a normal-conducting material which are arranged alternatingly and each of the layers extending from said core region to said outermost region.

12. A method of producing a superconducting wire comprising the steps of preparing a superconducting material and a normal-conducting material surrounding said superconducting material such that at least one space is formed therebetween, charging said space in layers alternatingly with pieces of a paramagnetic salt and a normal-conducting material, each of said layers extending from said superconducting material to the normal-conducting material surrounding said superconducting material, and pressurizingf said pieces to compact the same, evacuating the thus formed structure with its one end closed, closing the other end of said structure to form a billet, and subjecting said billet to drawing.

13. A method of producing a superconducting wire comprising the steps of forming a core region including a superconducting material, as a first element; forming an outermost region and an intermediate region with each other as a second element, said second element being formed to accommodate said first element therein, said outermost region being formed of a normal-conducting material and said intermediate region being formed of layers of a paramagnetic salt and a normal-conducting material which are arranged alternatingly and such that each of the layers extend from the outermost region to the core region; and combining the first and second elements such that the first element is accommodated in said second element.

* * * * *